(12) United States Patent
Savanth et al.

(10) Patent No.: US 10,049,739 B2
(45) Date of Patent: Aug. 14, 2018

(54) LATCHING DEVICE AND METHOD

(71) Applicant: ARM Ltd., Cambridge (GB)

(72) Inventors: Parameshwarappa Anand Kumar Savanth, Cambridgeshire (GB); James Edward Myers, Cambridgeshire (GB); Shidhartha Das, Cambridgeshire (GB)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/641,062

(22) Filed: Jul. 3, 2017

(65) Prior Publication Data

US 2017/0330618 A1  Nov. 16, 2017

Related U.S. Application Data

(63) Continuation of application No. 14/979,207, filed on Dec. 22, 2015, now Pat. No. 9,734,895.

(51) Int. Cl.
*H03K 17/06* (2006.01)
*G11C 13/00* (2006.01)

(52) U.S. Cl.
CPC ........ *G11C 13/0069* (2013.01); *G11C 13/004* (2013.01); *G11C 13/0007* (2013.01); *G11C 2013/0078* (2013.01)

(58) Field of Classification Search
CPC combination set(s) only.
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2008/0106926 A1 | 5/2008 | Brubaker | |
| 2008/0107801 A1 | 5/2008 | Celinska et al. | |
| 2010/0073991 A1 | 3/2010 | Yamada et al. | |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2016/0163978 A1 | 6/2016 | Paz De Araujo et al. | |

(Continued)

OTHER PUBLICATIONS

Notification of Transmittal of the International Search Report and the Written Opinion of the International Searching Authority, or the Declaration; International Patent Application No. PCT/GB2016/053924, dated Mar. 1, 2017, 1 pg.

(Continued)

*Primary Examiner* — An Luu
(74) *Attorney, Agent, or Firm* — Berkeley Law & Technology Group, LLP

(57) ABSTRACT

According to one embodiment of the present disclosure, an apparatus is provided. The apparatus comprises a data input to receive a data signal. The apparatus further comprises a latching circuitry. The latching circuitry comprises a first Correlated Electron Switch (CES) element and a second CES element. The latching circuitry further comprises a control circuit coupled to the first CES element and the second CES element. The control circuit is configured to program impedance states of the first CES element and the second CES element based on the data signal.

22 Claims, 7 Drawing Sheets

(56) References Cited

U.S. PATENT DOCUMENTS

| | | |
|---|---|---|
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

International Search Report; International Patent Application No. PCT/GB2016/053924, dated Mar. 1, 2017, 6 pgs.

The Written Opinion of the International Searching Authority; International Patent Application No. PCT/GB2016/053924, dated Mar. 1, 2017, 7 pgs.

Inque, et. al.; "Strong electron correlation effects in non-volatile electronic memory devices"; Non-Volatile Memory Technology Symposium, Nov. 7, 2005, pp. 131-136.

LATCHING DEVICE AND METHOD

CROSS REFERENCE TO RELATED APPLICATIONS

This application is a continuation of U.S. patent application Ser. No. 14/979,207, filed Dec. 22, 2015, titled "LATCHING DEVICE AND METHOD," assigned to the assignee of claimed subject matter and incorporated herein by reference in its entirety.

FIELD OF THE INVENTION

The present disclosure relates to data storage circuits and more particularly, to latching circuits comprising a correlated electron switch (CES) element.

BACKGROUND

A flip-flop or latch is a circuit that has two stable states and can be used to store state information. Such a circuit is generally used as a data storage element. A single latch stores one bit of data as long as the latch circuit is powered. Further, an output of a latch circuit varies based on the input as long as an enable signal is asserted. Typical latch circuits are volatile, i.e., the data stored in the latch circuit is lost when a power supply to the latch circuit is turned off. A conventional technique to enable a latching circuit to retain data includes coupling the latching circuit to a retention latch with its own separate power supply. In this technique, when the power supply to the latching circuit is switched off, data stored in the latching circuit is copied to the retention latch. However, such an approach requires redundant circuitry, which requires additional space in an integrated circuit that could otherwise have been saved. Further, an additional power supply is required, thereby adding to the overall power consumption of the latching circuit.

SUMMARY

According to a first aspect of the present technique, an apparatus is provided. The apparatus comprises a data input to receive a data signal. The apparatus further comprises a latching circuitry. The latching circuitry comprises a first Correlated electron Random Access Memory (CES) element and a second CES element. The latching circuitry further comprises a control circuit coupled to the first CES element and the second CES element. The control circuit is configured to program impedance states of the first CES element and the second CES element based on the data signal.

In embodiments, the control circuit programs the first CES element into a first impedance state and the second CES element in a second impedance state when the data signal is at logic one.

In embodiments, the control circuit programs the first CES element into the second impedance state and the second CES element into the first impedance state when the data signal is at logic zero.

The control circuit may comprise: a first transistor connected between the first CES element and a power supply, wherein a gate input of the first transistor is connected to a first control signal and to a complement of the data signal; a second transistor connected to the first CES element, wherein a gate input of the second transistor is connected to the first control signal and to the complement of the data signal; a third transistor connected to the second CES element, wherein a gate input of the third transistor is connected to the data signal and the first control signal; a fourth transistor and a second data signal connected between the second CES element and the power supply wherein a gate input of the third transistor is connected to the data signal and the first control signal; and a fifth transistor connected to the second transistor, the third transistor and the power supply, wherein a gate input of the first transistor is connected to a second control signal, wherein the fifth transistor is configured to provide a voltage drop when switched ON.

The second control signal may be a write enable signal and the first control signal may be a complement of the write enable signal.

In embodiments, when the first control signal is asserted (applied), the first transistor is turned ON and the second transistor is turned OFF when the data signal is at logic one, such that the first transistor provides a first programming signal to the first CES element to program the first CES element to the first impedance state.

In embodiments, when the first control signal is applied, the first transistor is turned OFF and the second transistor is turned ON when the data signal is at logic zero, such that the second transistor provides a second programming signal to the first CES element to program the first CES element to the second impedance state.

In embodiments, when the first control signal is applied, the third transistor is turned ON and the fourth transistor is turned OFF when the data signal is at logic one, such that the third transistor provides a third programming signal to the second CES element to program the second CES element to the second impedance state.

In embodiments, when the first control signal is applied, the third transistor is turned OFF and the fourth transistor is turned ON when the data signal is at logic zero, such that the fourth transistor provides a fourth programming signal to the second CES element to program the second CES element to the first impedance state.

The transistors may be PMOS transistors or NMOS transistors. In a particular embodiment, the first transistor and the fourth transistor may be PMOS transistors, and the second transistor, the third transistor and the fifth transistor may be NMOS transistors.

The first impedance state may be a low impedance state and the second impedance state may be a high impedance state.

The control circuit may be further configured to couple the first CES element and the second CES element in series when a read signal is applied such that the first CES element and the second CES element form an impedance divider.

The apparatus may comprise a data output connected to one of the first CES element and the second CES element, and configured to provide an output signal dependent on the impedance state of the connected CES element.

According to a second aspect of the present technique, there is provide a method comprising: receiving a data signal to be latched in a latching circuit, the latching circuit comprising a first Correlated Electron Switch (CES) element and a second CES element; programming an impedance state of the first Correlated Electron Switch (CES) element; programming an impedance state of the second CES element; and latching the received data signal in the latching circuit.

The method may further comprise: receiving a control signal; and programming the impedance state of the first CES element and the second CES element based on the received control signal.

Programming the impedance state of the first CES element and the second CES element may comprise: programming the first CES element into a first impedance state and the second CES element into a second impedance state when the data signal corresponds to logic one.

Programming the impedance state of the first CES element and the second CES element may comprise: programming the first CES element into the second impedance state and the second CES element into the first impedance state when the data is logic zero.

As mentioned above, the first impedance state may be a low impedance state and the second impedance state may be a high impedance state.

The method may further comprise coupling the first CES element and the second CES element in series during a read operation such that the first CES element and the second CES element form an impedance divider.

The method may comprise providing an output signal dependent on the impedance state of one of the first CES element and the second CES element.

In a related aspect of the present technique, there is provided a non-transitory data carrier carrying code which, when implemented on a processor, causes the processor to carry out the methods described herein.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

BRIEF DESCRIPTION OF THE DRAWINGS

The techniques are diagrammatically illustrated, by way of example, in the accompanying drawings, in which.

DETAILED DESCRIPTION

Figure 1:
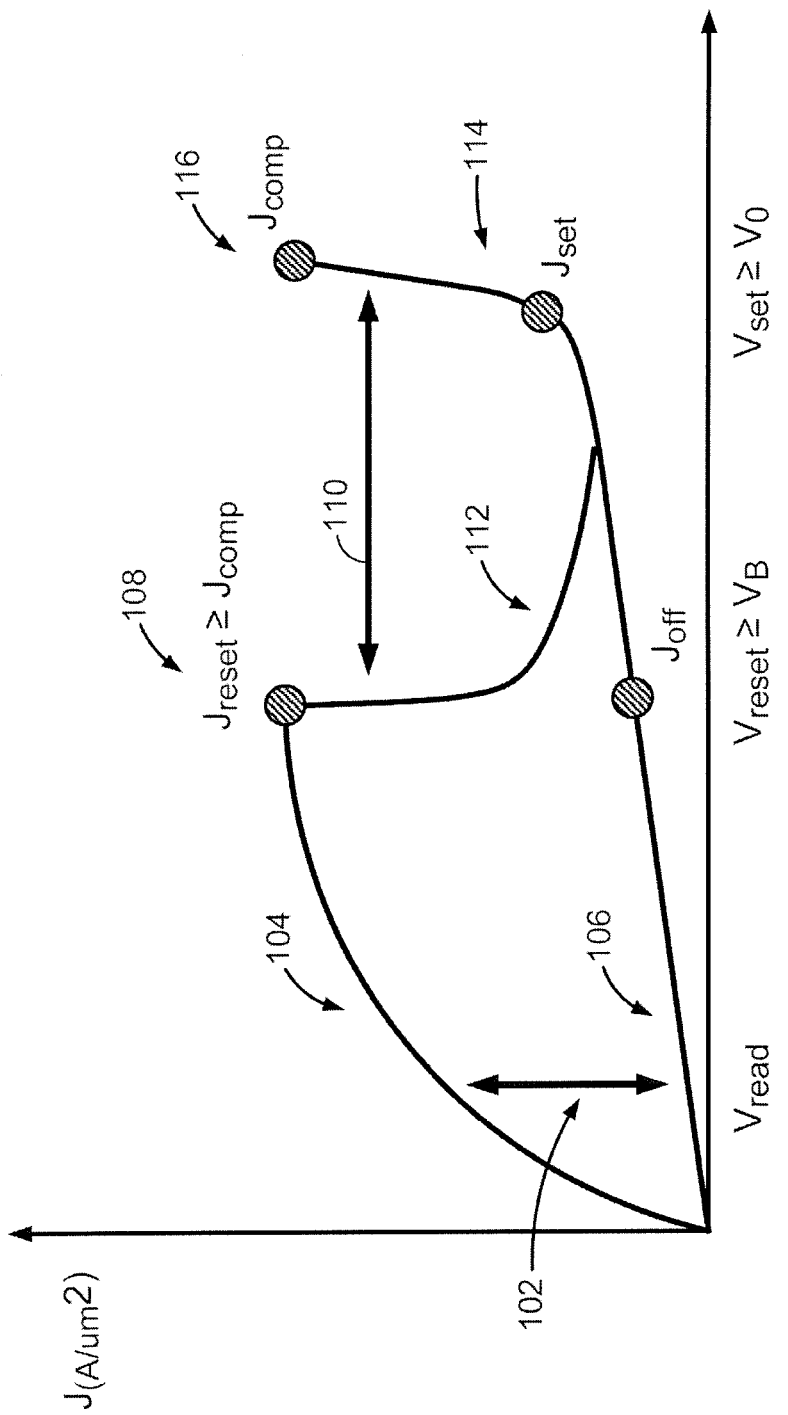
FIG. 1 shows a plot of current density versus voltage for a Correlated Electron Switch (CES) element.

Broadly speaking, embodiments of the present techniques provide a latching circuit configured to store/latch data when a power supply has been disconnected or turned off. The latching circuitry configured to latch the data comprises at least one Correlated Electron Switch (CES) element, which comprises a correlated electron material (CEM). The CES may be used both as non-volatile storage as well as a circuit element that can enable connectivity in a circuit. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

A CES is a particular type of switch formed (wholly or in part) from a CEM. Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$, required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$(at $J_{reset}$) and $V_{set}$(at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
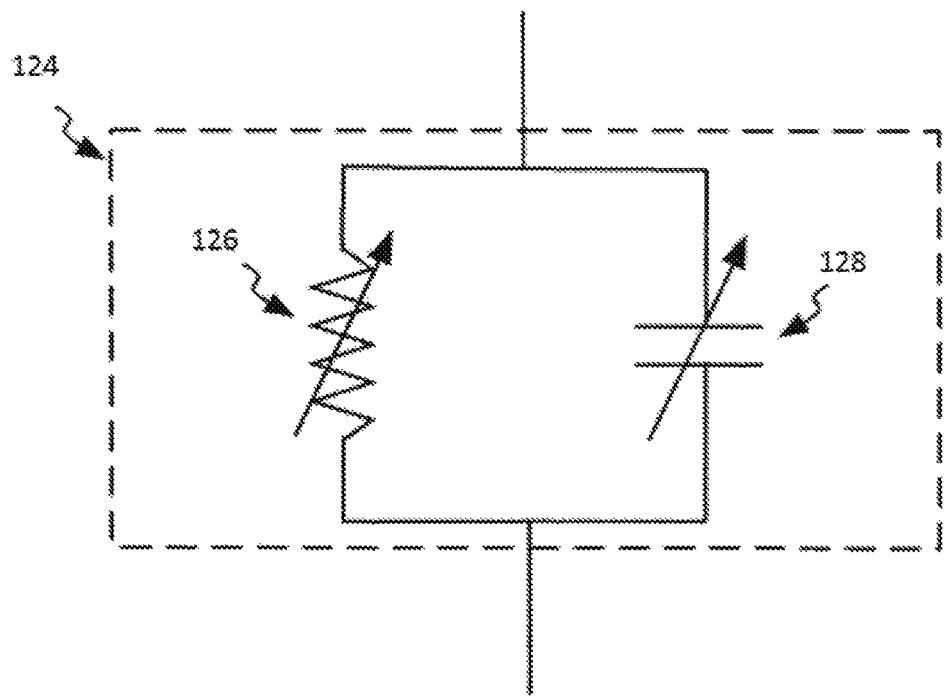
FIG. 2 is a schematic diagram of an equivalent circuit to a CES device.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

Figure 3:
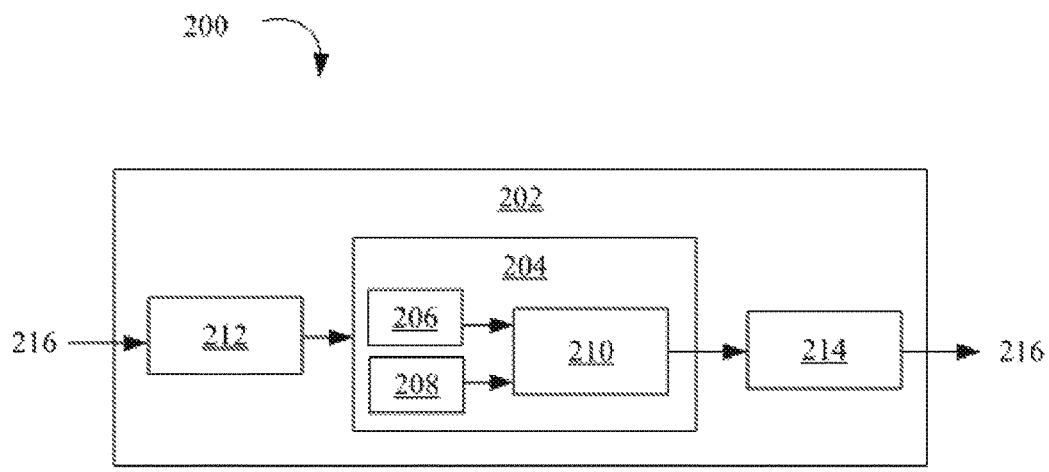
FIG. 3 illustrates an exemplary apparatus comprising a CES based latch, according to an embodiment of the present disclosure.

FIG. 3 illustrates a schematic 200 of an exemplary apparatus 202, according to an embodiment of the present techniques. In an embodiment, the apparatus 202 may be an integrated circuit having one or more logic circuits including a latching circuit. The apparatus 202 may be, for example, a microprocessor, a microcontroller, a communication module, a memory device, or any apparatus that includes one or more latching circuits. The apparatus 202 may be provided in or be part of an electronic device, such as a personal computer, a laptop, a desktop, a tablet, a mobile phone, a smartphone, a display or display device, a television, a calculator, a personal digital assistant (PDA), and the like.

In an implementation, the apparatus 202 may comprise a latching circuit 204. The apparatus 202 may further comprise a data input 212 and a data output 214. The data input 212 may be configured to receive a data signal 216 to be latched onto (stored in) the latching circuit 204. The data output 210 may be configured to output an output signal 216. The output signal 216 represents the data latched in (stored in) the latching circuit 204.

The latching circuit 204 may include a first Correlated Electron Switch (CES) element 206, a second CES element 208, and a control circuit 210. As depicted in FIG. 3, the control circuit 210 may be coupled to the first CES element 206 and the second CES element 208. Further, the control circuit 210 may include at least one control input (not shown) to receive at least one control signal (not shown). In an embodiment, the control signal may include one or more of a read enable signal, a write enable signal, a read/write enable signal and the like. In one implementation, the control circuit 210 may be configured to perform a write operation to latch data provided by the data signal 216 into the latching circuit 204 by programming impedance states of the first CES element 206 and the second CES element 208 dependent on the at least one the control signal. For example, the control circuit 210 may latch the data into the latching circuit 204 when the write enable signal is asserted. Further, the control circuit 210 may be configured to perform a read operation to read data from the latching circuit 204. For example, the control circuit 210 is configured to provide the output signal 216 based upon impedance states of both the first CES element 206 and the second CES element 208.

Figure 4:
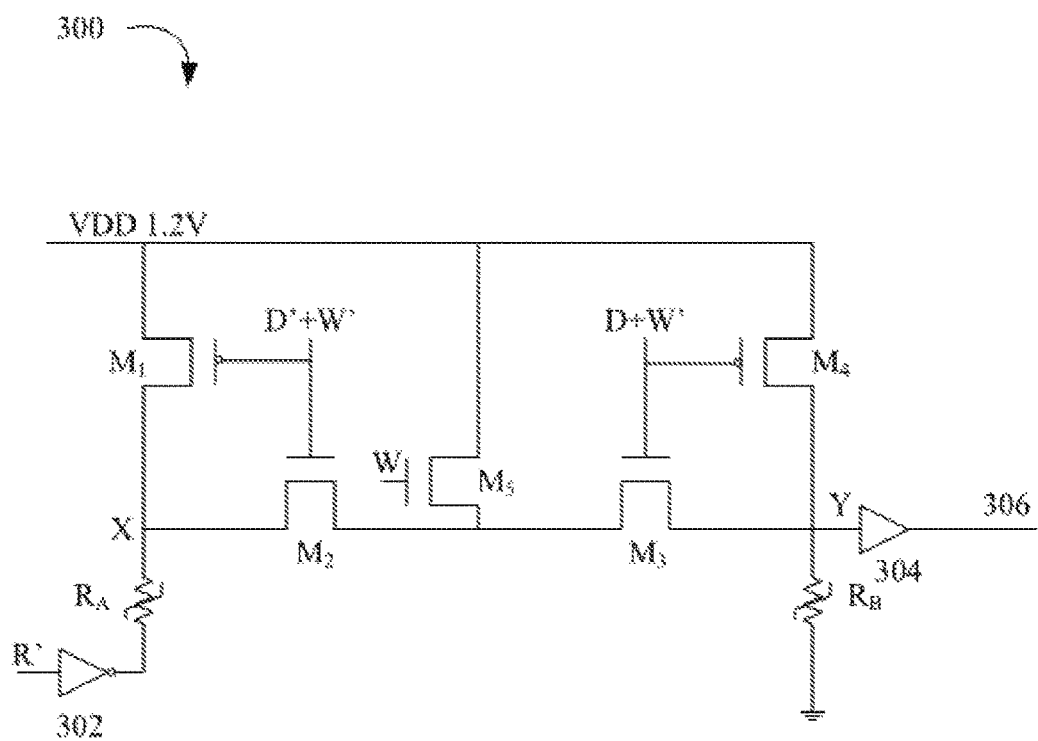
FIG. 4 illustrates an example circuit for a CES based latch, according to an embodiment of the present disclosure.

FIG. 4 illustrates an exemplary latching circuit 300, according to an embodiment of the present techniques. The latching circuit 300 includes a first CES element $R_A$ and a second CES element $R_B$. The latching circuit 300 may further include a first transistor $M_1$ and a second transistor $M_2$, connected to the first CES element $R_A$. The latching circuit 300 may also include a third transistor $M_3$ and a fourth transistor $M_4$, connected to the second CES element $R_B$. The latching circuit 300 may further include a fifth transistor $M_5$ connected between the transistors $M_2$ and $M_3$. In an embodiment, the transistor $M_5$ may be designed such that transistor $M_5$ provides a voltage drop when switched ON. The transistors $M_1$ to $M_5$ may form a control circuit, such as control circuit 210. In an embodiment, the transistors $M_1$ and $M_4$ may be PMOS transistors and the transistors $M_2$, $M_3$ and $M_5$ may be NMOS transistors. It will be appreciated that the types of transistors illustrated and described here are only exemplary and suitable modifications can be made to the latching circuit 300 when implemented using different types of transistors without deviating from the scope of the present techniques.

In one implementation, gate inputs of the transistors $M_1$ and $M_2$ may be connected to a complement of the data signal (denoted by D') and a first control signal (denoted by W'). (The 'data signal' may also be known as, and referred to herein as, the 'bit line signal', or 'bit line'. The 'complement' of the data signal may also be known as, and referred to herein as, the 'bit line bar signal' or 'bit line bar'). In an embodiment the first control signal is a complement of a write enable data signal. The complement of the data signal may be obtained by inverting the data signal (for example, the data signal 216) using an inverter (not shown). Similarly, the complement of the write enable data signal may be obtained by inverting the write enable data signal using an inverter (not shown). The signals D' and W' are combined using a bitwise OR operation before connecting to the gate input of the transistors $M_1$ and $M_2$. Similarly, gate inputs of the transistors $M_3$ and $M_4$ may be connected to the data signal (denoted by D) and the first control signal (denoted by W'), wherein the signals D and W' are combined using a bitwise OR operation. Also, a gate input of the transistor $M_5$ may be connected to the write enable data signal (denoted by W).

The latching circuit 300 may further include a first inverter 302 and a driver 304. The first inverter 302 may be connected to the first CES element $R_A$. An input of the first inverter 302 may be connected to a complement of a read enable data signal (denoted by R'). The complement of the read enable data signal may be obtained by inverting the read enable data signal (denoted by R) using an inverter (not shown). In the current example, separate write enable and read enable data signals are used. In an embodiment, a single control signal may be used for enabling read and write operations separately. For example, the read operation may be enabled by pulling such a control signal high, and the write operation may be enabled by pulling the control signal low (denoted by R/W'). Alternatively, the write operation may be enabled by pulling the control signal high, and the read operation may be enabled by pulling the control signal low (denoted by R'/W). Suitable modifications may be made to the latching circuit 300 to allow operation using such a control signal. The driver 304 is connected to the second CES element $R_B$. The driver 304 is used to maintain suitable logic levels at the cell boundary. The second CES element $R_B$ is also connected to ground, as depicted. The latching circuit 300 may also include a power supply denoted by $V_{DD}$. In an embodiment, $V_{DD}$ may be equal to about 1.2V, but this is merely an illustrative, non-limiting example. Further, the data may be output at a data terminal 306 connected to the first CES element $R_A$ or the second CES element $R_B$. In the current example, the data output 306 is connected to the second CES element $R_B$ at node Y via the driver 304. In another embodiment, the data output may be 306 may be connected to the first CES element $R_A$. In this case the driver 304 may be connected to a node X. Further, in an embodiment, the second CES element $R_B$ may be connected to the first inverter 302 instead of to ground and the first CES element $R_A$ may be connected to ground instead of the first inverter 302.

Figure 5:
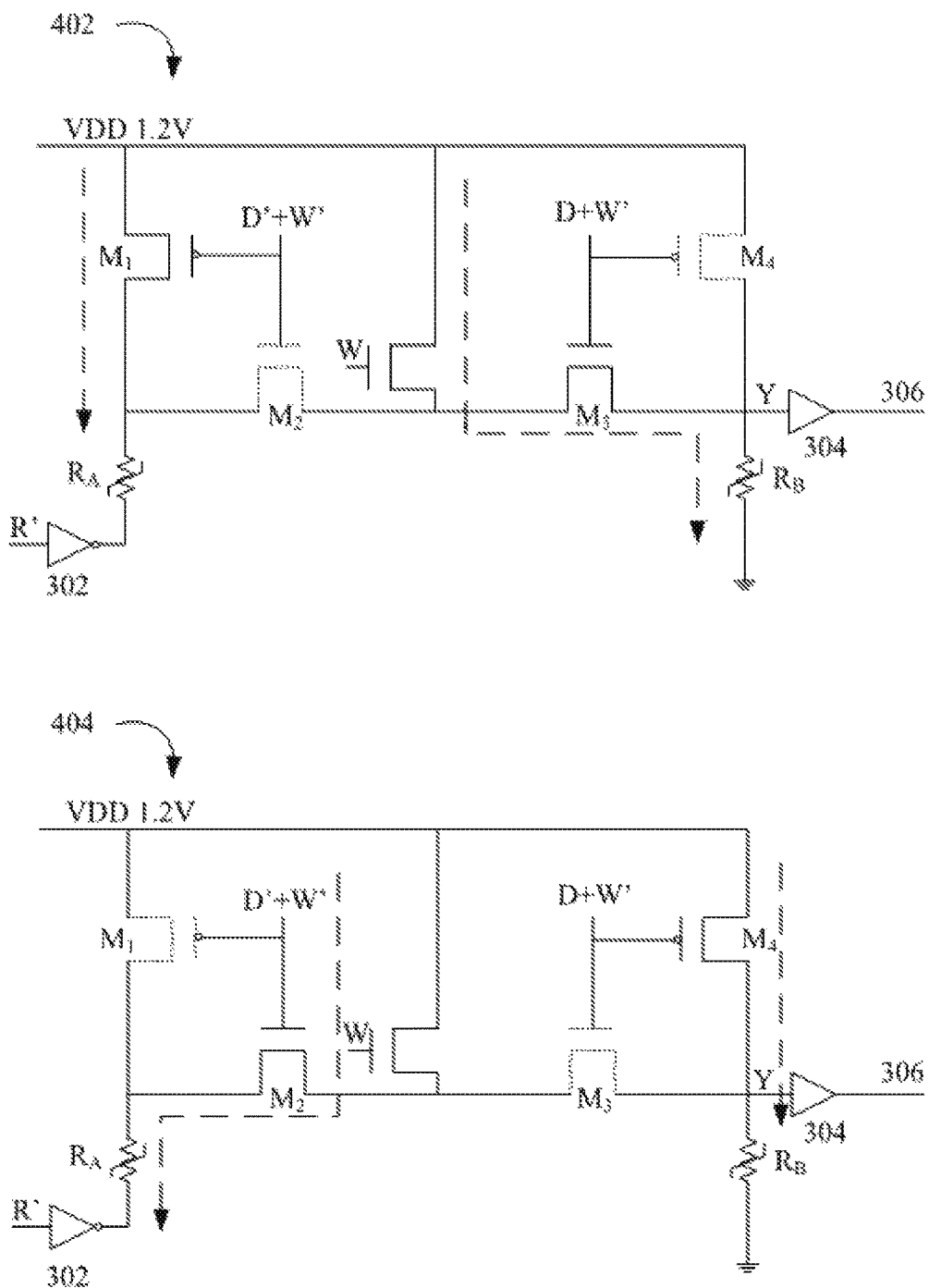
FIG. 5 illustrates working of the CES based latch when data is latched, according to an embodiment of the present disclosure.
Figure 6:
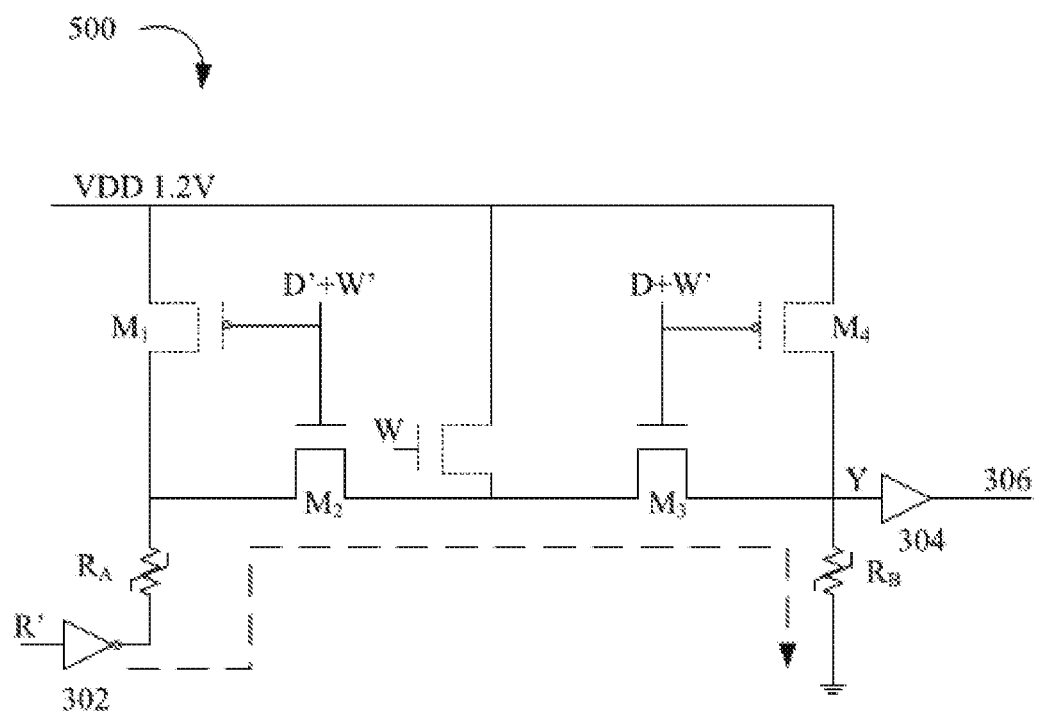
FIG. 6 illustrates working of the CES based latch when the data is read, according to an embodiment of the present disclosure.

The operation of the latching circuit 300 is now described in detail in conjunction with FIGS. 5 and 6. FIG. 5 illustrates the write operation of the latching circuit 300, in accordance with an embodiment of the present disclosure. FIG. 5 depicts two different modes 402 and 404, for latching the data signal at a logic one and a logic zero, respectively. In the current example, the write operation is enabled by pulling the write enable data signal (W) high. Consequently, the complement of the write enable data signal (W') is pulled low. Also, reading is disabled by pulling the read enable data signal (R) low.

In the mode 402, W is pulled high and D is also pulled high. Therefore, both W' and D' are pulled low. Consequently, the signal (D'+W') becomes low and the signal (D+W') becomes high. As a result, the transistor $M_1$ is switched ON and the transistor $M_2$ is switched OFF. In this example, when the transistor $M_1$ is switched ON, the power supply voltage $V_{DD}$ is provided across the first CES element $R_A$, through the transistor $M_1$. This voltage, in an implementation, may be equal to the SET voltage of the first CES element $R_A$. Further, the transistor $M_1$ may be designed so as to provide a current signal (or a current density) required to program the first CES element $R_A$ to the SET state. Thus, in said configuration, the first CES element $R_A$ is caused to be in a SET state, i.e., a low impedance state. In one example, the low impedance state may be a low resistance state, a low capacitance state or a combination thereof.

Further, due to the signal (D+W') being high, the transistor $M_3$ is switched ON and the transistor $M_4$ is switched OFF. In addition, the transistor $M_5$ is switched ON as W is high. Consequently, the second CES element $R_B$ is connected to the power supply through the transistors $M_5$ and $M_3$. As described above, the transistor $M_5$ may be chosen such that it provides a voltage drop when switched ON. In an embodiment, the voltage drop may be about 0.6V, but this is merely an illustrative, non-limiting example value. Due to said voltage drop, the voltage across $R_B$ is equal to about 0.6V. In an embodiment, this voltage may be equal to or greater than a RESET voltage of the second CES element $R_B$. Further, the transistor $M_3$ may be designed so as to provide a current signal (or a current density) required to program the second CES element $R_B$ to a RESET state. Consequently, the second CES element $R_B$ is caused to be in the RESET state, i.e., a high impedance state. In one example, the high impedance state may be a high resistance state, a high capacitance state or a combination thereof. Thus, the data signal D=1 is stored in the latching circuit 300 by programming the first CES element $R_A$ in the low impedance state and the second CES element $R_B$ in the high impedance state.

In the mode 404, the data signal is at logic 0, i.e., D=0. Therefore, the signal (D'+W') is high and the signal (D+W') is low. Consequently, the transistors $M_2$ and $M_4$ are switched ON and the transistors $M_1$ and $M_3$ are switched OFF. In such a configuration, the voltage across the second CES element $R_B$ is substantially equal to $V_{DD}$. In an embodiment, this voltage may be equal to the SET voltage of the second CES element $R_B$. Further, the transistor $M_4$ may be designed/ selected so as to provide a current signal (or a current density) required for programming the second CES element $R_B$ to the SET state. Therefore, the second CES element $R_B$ is caused to be in the SET state, i.e., the low impedance state. Further, a voltage across the first CES element $R_A$ is equal to $V_{DD}$ minus the voltage drop at the transistor $M_5$. In the current example, the voltage across the first CES element $R_A$ is about 0.6V, but this is merely an illustrative, non-limiting example value. In an embodiment, the voltage across the first CES element $R_A$ may be equal to or greater than the RESET voltage of the first CES element $R_A$. Further, the transistor $M_2$ may be designed so as to provide a current signal (or a current density) necessary for the first CES element $R_A$ to switch to the RESET state. Therefore, the first CES element $R_A$ is caused to be in the RESET state, i.e., the high impedance state. Thus, the data signal D=0 is stored in the latching circuit 300 by programming the first CES element $R_A$ in the high impedance state and the second CES element $R_B$ in the low impedance state.

FIG. 6 depicts the read operation of the latching circuitry 300, in accordance with an embodiment of the present technique. In one implementation, during the read operation, the read enable signal (R) is pulled high and the read enable bar signal (R') becomes low. Further, the write enable signal (W) is pulled low and the write enable bar signal (W') becomes high. Consequently, the transistors $M_1$, $M_4$ and $M_5$ are switched OFF and the transistors $M_2$ and $M_3$ are switched ON. As a result, the first CES element $R_A$ and the second CES element $R_B$ are connected in series through the transistors $M_2$ and $M_3$. As the impedances of the transistors $M_2$ and $M_3$ are negligible compared to the impedances of the first CES element $R_A$ and the second CES element $R_B$, the first CES element $R_A$ and the second CES element $R_B$ form an impedance divider. During the read operation, current in the circuit flows through the input of the first inverter 302, the first CES element $R_A$, the transistors $M_2$ and $M_3$ and the second CES element $R_B$. The data that has been latched may be read at the data output 306 of the driver 304 connected to the node Y.

Consider an example where the data latched into the latching circuit 300 has a value of logic 1. As described above, when data to be latched has a value of logic 1, the first CES element $R_A$ is programmed in the low impedance state (for example, in the low resistance state), and the second CES element $R_B$ is programmed to the high impedance state (for example, the high resistance state). Assuming that the resistance of the first CES element $R_A$ when in the low resistance state is LR, and the resistance of the second CES element $R_B$ when in the high resistance state is HR, a voltage drop across the second CES element $R_B$, i.e., the voltage at the node Y may be given by the following equation:

$$V(Y) = V_{DD}\left(\frac{HR}{LR + HR}\right)$$

The values of LR and HR may be dependent on the design of the first CES element $R_A$ and the second CES element $R_B$. In an embodiment, the values of LR and HR are set such that the voltage at the node Y may be approximately 0.9 times $V_{DD}$, i.e., 1.08 volts, but this is merely an illustrative, non-limiting example value. This value of the voltage at the node Y may be representative of a high output, indicating that the data at logic 1 has been latched into the latching circuit 300. Consequently, the output signal at the data output 306 to is at logic one.

Similarly, as described in conjunction with FIG. 5, when the data latched into the latching circuit 300 has a value of logic 0, the first CES element $R_A$ is programmed in the high impedance state (for example, the high resistance state), and the second CES element $R_B$ is programmed to the low impedance state (for example, the low resistance state). The voltage drop across the second CES element $R_B$, i.e., the voltage at the node Y may then be given by the following equation:

$$V(Y) = V_{DD}\left(\frac{LR}{LR + HR}\right)$$

In an embodiment, the value of LR and HR may be designed such that the voltage at the node Y may be approximately 0.1 times $V_{DD}$, i.e., 0.12 volts, but this is merely an illustrative, non-limiting example value. This value of the voltage at the node Y may be representative of a low output, indicating that the data at logic 0 has been latched into the latching circuit 300. Consequently, the output signal at the data output 306 is at logic zero.

In an embodiment, the series connection of the first CES element $R_A$ and the second CES element $R_B$, (where either the first CES element or the second CES element is in the high resistance state exhibiting the resistance of HR), limits a current flowing through the first CES element $R_A$ and the second CES element $R_B$ during the read operation, such that the current does not exceed a threshold value. The threshold value may be a compliance current at which a CES element flips from one impedance state to another impedance state. In an embodiment, LR may be set in the order of 100K Ohm and the HR may be set in the order of 10 M Ohm, but these are merely illustrative, non-limiting example values. Thus, the current through the CES elements $R_A$ and $R_B$ is limited to about 100 nA whereas the compliance current may be of the order of 10 uA. Since the current during the read operation is limited to be below the compliance current, accidental change in state of the CES elements $R_A$ and $R_B$ may be prevented.

Figure 7:
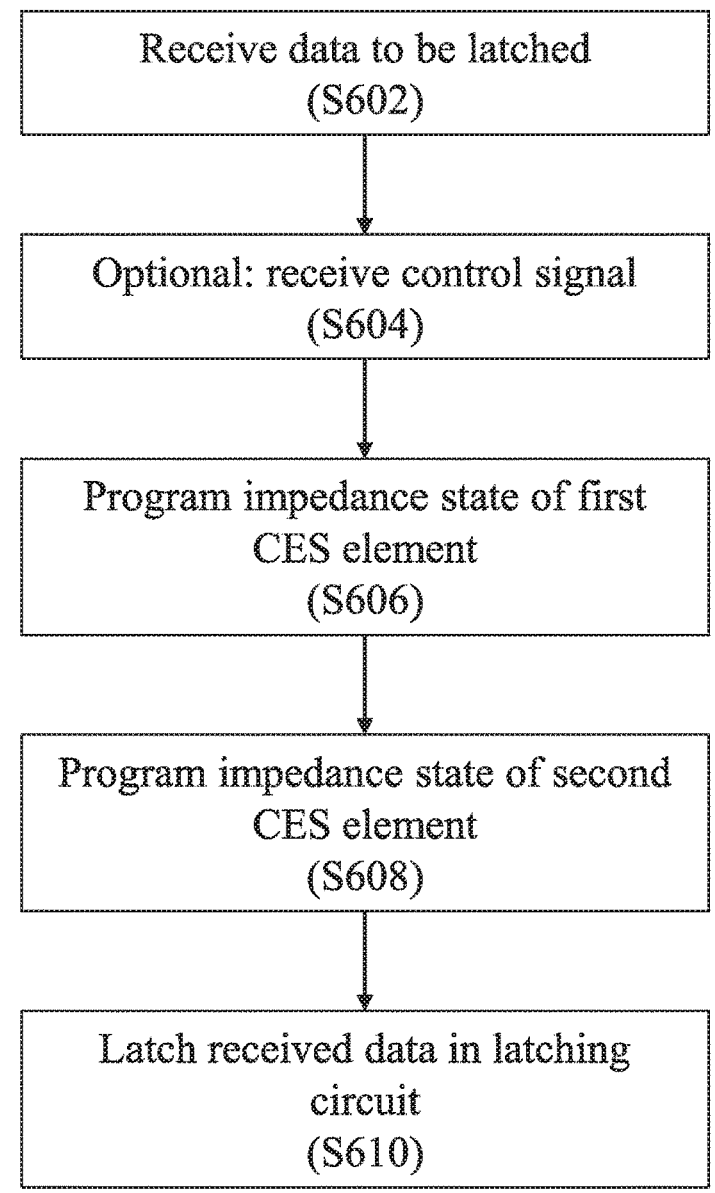
FIG. 7 illustrates an exemplary method for latching data, according to an embodiment of the present disclosure.

FIG. 7 illustrates an exemplary method 600 for latching data, in accordance with an embodiment of the present techniques. The method begins by receiving data to be latched (S602). In an example, the received data may be binary logic data. Optionally, a control signal may also be received (S604), which may be used to perform a write operation, i.e. to latch the received data into the latching circuit, or a read operation, i.e. to read the latched data from the latching circuit. In embodiments, the control signal may include one or more of a read enable signal, a write enable signal, a read/write enable signal and the like.

The impedance state of the first CES element is programmed (step S606) and the impedance state of the second CES element is programmed (step S608), depending on whether a high or low impedance state is required for each CES element. The order in which the CES elements are programmed is non-limiting. The programming of the impedance state may optionally depend on the control signal. At step S610, the received data is latched into a latching circuit such as the latching circuit 204 or the latching circuit 300. The latching circuit may include a first CES element and a second CES element. In an embodiment, the data is latched by programming impedance states of the first CES element and the second CES element based on the received data. In one example, the impedance states may comprise resistance states, capacitance states or a combination thereof. In an embodiment, the impedance states may comprise a low impedance state and a high impedance state. In one implementation, the first CES element may be programmed to a high impedance state and the second CES element may be programmed to a low impedance state when the data is at logic 0. Further, the first CES element may be programmed to the low impedance state and the second CES element may be programmed to a high impedance state when the data is at logic 1.

Once the data is latched into the latching circuit, the data may be read by coupling the first CES element and the second CES element in series to form an impedance divider and providing an output signal (indicative of the latched data) in dependence of the impedance states of the first CES element and the second CES element. The output signal may be provided at a data output connected to one of the first CES element and the second CES element.

As described herein, the present techniques provide a CES-based latch where the data is latched in the form of impedance states of two CES elements. The CES elements are non-volatile elements. In other words, once programmed the CES elements retain their impedance states even if a power supply is switched off. Due to the non-volatile nature of the CES elements, the latch is also able to retain the latched data even if the power supply to the latch is switched off. Accordingly, in embodiments, the CES-based latch may not require an additional retention latch, thereby saving on valuable chip space. In addition, as no extra power supply is needed for the additional retention latch, or otherwise, power consumption may be reduced.

Embodiments of the present techniques also provide a non-transitory data carrier carrying code which, when implemented on a processor, causes the processor to carry out the methods described herein. The processor may be provided within or coupled to the control circuit 210 used to program the CES elements 206 and 208 into a particular impedance state.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory data carrier—such as a disk, microprocessor, CD- or DVD-ROM, programmed memory such as read-only memory (firmware), or on a data carrier such as an optical or electrical signal carrier. The code may be provided on a carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform all the steps of the above-described method.

Moreover, the present disclosure is able to program the two CES elements using only a single power supply. Therefore, multiple supply voltages are not required to program the CES elements in different impedance states. Further, with the help of the invertor and the driver, the proposed latching circuit is able to maintain near logic levels at the cell boundary, saving on interface circuitry which may otherwise have been required. Also, precise tuning of the transistors in the latching circuit to match voltage drops is not required.

Although illustrative embodiments of the disclosure have been described in detail herein with reference to the accompanying drawings, it is to be understood that the disclosure is not limited to those precise embodiments, and that various changes and modifications can be effected therein by one skilled in the art without departing from the scope and spirit of the disclosure as defined by the appended claims.

What is claimed is:

1. An apparatus comprising:
    a data input to receive a data signal; and
    latching circuitry, configured to latch the data signal, the latching circuitry comprising:
    a first Correlated Electron Switch (CES) element;
    a second CES element; and
    a control circuit, coupled to the first CES element and the second CES element, the control circuit configured to apply programming signals to the first CES element and the second CES element placing the first CES element and the second CES element in a low impedance or conductive state, or a high impedance or insulative state based, at least in part, on the data signal, wherein a first programming signal applied by the control circuit to place the first CES element in the low impedance or conductive state applies a first write voltage and a first write current across terminals of the first CES element, and wherein a second programming signal applied by the control circuit to place the first CES element in the high impedance or insulative state applies a second write current and a second write voltage across terminals of the first CES element, wherein a magnitude of the second write current exceeds a magnitude of the first write current, and wherein a magnitude of the first write voltage exceeds a magnitude of the second write voltage.

2. The apparatus of claim 1, wherein the control circuit is configured to program the first CES element into a first impedance state and the second CES element into a second impedance state when the data signal is at logic one.

3. The apparatus of claim 2, wherein the control circuit is configured to program the first CES element into the second impedance state and the second CES element into the first impedance state when the data signal is at logic zero.

4. The apparatus of claim 2, wherein the control circuit comprises:
    a first transistor connected between the first CES element and a power supply, wherein a gate input of the first transistor is connected to a first control signal and to a complement of the data signal;
    a second transistor connected to the first CES element, wherein a gate input of the second transistor is connected to the first control signal and to the complement of the data signal;
    a third transistor connected to the second CES element, wherein a gate input of the third transistor is configured to receive the data signal and the first control signal;
    a fourth transistor connected between the second CES element and the power supply wherein a gate input of the third transistor is connected to the data signal and the first control signal; and
    a fifth transistor connected to the second transistor, the third transistor and the power supply, wherein a gate input of the first transistor is connected to a second control signal, wherein the fifth transistor is configured to provide a voltage drop when switched ON.

5. The apparatus of claim 4, wherein the second control signal comprises a write enable signal and the first control signal comprises a complement of the write enable signal.

6. The apparatus of claim 4, wherein responsive to application of the first control signal, the first transistor is turned ON and the second transistor is turned OFF when the data signal is at logic one, such that the first transistor applies a programming signal to the first CES element to place the first CES element into the first impedance state.

7. The apparatus of claim 4, wherein responsive to application of the first control signal, the first transistor is turned OFF and the second transistor is turned ON when the data signal is at logic zero, such that the second transistor applies a programming signal to the first CES element to place the first CES element into the second impedance state.

8. The apparatus of claim 4, wherein in response to application of the first control signal, the third transistor is turned ON and the fourth transistor is turned OFF when the data signal is at logic one, such that the third transistor applies a programming signal to the second CES element to place the second CES element into the second impedance state.

9. The apparatus of claim 4, wherein in response to application of the first control signal, the third transistor is turned OFF and the fourth transistor is turned ON when the data signal is at logic zero, such that the fourth transistor applies a programming signal to the second CES element to place the second CES element into the first impedance state.

10. The apparatus of claim 4, wherein the first transistor and the fourth transistor are PMOS transistors, and wherein the second transistor, the third transistor and the fifth transistor are NMOS transistors.

11. The apparatus of claim 2, wherein the first impedance state comprises the low impedance or conductive state and the second impedance state comprises the high impedance state or insulative state.

12. The apparatus of claim 1, wherein the control circuit is further configured to couple the first CES element and the second CES element in series responsive to application of a read signal such that the first CES element and the second CES element form an impedance divider.

13. The apparatus of claim 1, further comprising a data output terminal connected to the first CES element or the second CES element, and configured to provide an output signal dependent on an impedance state of the connected CES element.

14. The apparatus of claim 1, wherein the first CES element comprises a correlated electron material (CEM), and wherein the CES element is programmable to be in the low impedance or conductive state, or the high impedance or insulative state based on a localization of electrons in at least a portion of the CEM.

15. A method comprising:
receiving a data signal to be latched in a latching circuit, the latching circuit comprising a first Correlated Electron Switch (CES) element and a second CES element;
programming an impedance state of the first CES element;
programming an impedance state of the second CES element; and
latching the received data signal in the latching circuit, wherein the first CES element is programmable to a low impedance or conductive state responsive to application of a first programming signal to the first CES element, the first programming signal having a first write voltage and a first write current, wherein the first CES is programmable to a high impedance or insulative state responsive to application of a second programming signal, the second programming signal having a second write voltage and a second write current, wherein a magnitude of the first write voltage is greater than a magnitude of the second write voltage, and wherein a magnitude of the second write current exceeds a magnitude of the first write current.

16. The method of claim 15 further comprising:
receiving a control signal; and
programming the impedance state of the first CES element and the second CES element based, at least in part, on the received control signal.

17. The method of claim 15, wherein programming the impedance state of the first CES element and the second CES element comprises: programming the first CES element into a first impedance state and the second CES element into a second impedance state when the data signal corresponds to logic one.

18. The method of claim 17 wherein programming the impedance state of the first CES element and the second CES element comprises: programming the first CES element into the second impedance state and the second CES element into the first impedance state when the data is logic zero.

19. The method of claim 17, wherein the first impedance state is a low impedance state and the second impedance state is a high impedance state.

20. The method of claim 15 further comprising:
coupling the first CES element and the second CES element in series during a read operation such that the first CES element and the second CES element form an impedance divider.

21. The method of claim 15 further comprising:
providing an output signal dependent on the impedance state of one of the first CES element and the second CES element.

22. The method of claim 15, wherein the first CES element comprises a correlated electron material (CEM), and wherein the CES element is programmable to be in the low impedance or conductive state, or the high impedance or insulative state based on a localization of electrons in at least a portion of the CEM.

* * * * *